(12) United States Patent
Marth et al.

(10) Patent No.: US 10,580,959 B2
(45) Date of Patent: Mar. 3, 2020

(54) ACTUATOR SYSTEM

(71) Applicant: PHYSIK INSTRUMENTE (PI) GMBH & CO. KG, Karlsruhe (DE)

(72) Inventors: Harry Marth, Waldbronn (DE);
Patrick Pertsch, Hermsdorf (DE);
Oskar Xiabin Zhao, Shanghai (CN)

(73) Assignee: PHYSIK INSTRUMENTE (PI) GMBH & CO. KG, Karlsruhe (DE)

( * ) Notice: Subject to any disclaimer, the term of this patent is extended or adjusted under 35 U.S.C. 154(b) by 462 days.

(21) Appl. No.: 15/327,692

(22) PCT Filed: Jul. 22, 2015

(86) PCT No.: PCT/DE2015/200411
§ 371 (c)(1),
(2) Date: Jan. 20, 2017

(87) PCT Pub. No.: WO2016/012021
PCT Pub. Date: Jan. 28, 2016

(65) Prior Publication Data
US 2017/0207382 A1    Jul. 20, 2017

(30) Foreign Application Priority Data

Jul. 23, 2014   (DE) .................. 10 2014 214 318
Nov. 14, 2014   (DE) .................. 10 2014 116 708

(51) Int. Cl.
*H01L 41/053*    (2006.01)
*H01L 41/09*     (2006.01)
*H01L 41/047*    (2006.01)

(52) U.S. Cl.
CPC ...... *H01L 41/0536* (2013.01); *H01L 41/0475* (2013.01); *H01L 41/053* (2013.01); *H01L 41/0986* (2013.01)

(58) Field of Classification Search
CPC .............. F04D 29/106; F04D 29/126
(Continued)

(56) References Cited

U.S. PATENT DOCUMENTS 5,166,908 A *  11/1992  Montgomery ........ E21B 47/124
                                              310/328
6,800,984 B2  10/2004  Marth ................. 310/323.02
(Continued)

FOREIGN PATENT DOCUMENTS

| DE | 101 48 267 A1 | 1/2003 |
| DE | 10 2006 032 995 A1 | 1/2008 |
| WO | WO 2008/009578 | 1/2008 |

OTHER PUBLICATIONS

Xue, et al., "Structure and closed-loop control of a novel compact deformable mirror for wavefront correction in a high power laser system", Laser Physics Letters, vol. 10, No. 4, Feb. 27, 2013 (Feb. 27, 2013), Retrieved from the Internet: URL: http://iopscience.iop.org/article/10.1088/1612-2011/10/4/045301 [retrieved on Apr. 3, 2017], the whole document. (last accessed on Apr. 3, 2017) (copy not enclosed).
(Continued)

*Primary Examiner* — Thomas M Dougherty
(74) *Attorney, Agent, or Firm* — Bodner & O'Rourke, LLP; Gerald T. Bodner; Christian P. Bodner

(57) ABSTRACT

The invention relates to an actuator system comprising at least four electrically controllable, longitudinally adjustable actuators, to each of which a compressive force is applied in the direction of the longitudinal adjustment thereof by means of a separate housing that has an integrally formed resilient portion, each housing being designed as a single piece along with a base element shared by all housings. The invention further relates to an array comprising a plurality of actuator systems of said type.

15 Claims, 4 Drawing Sheets

(58) Field of Classification Search
USPC .......................... 310/26, 311, 328, 340, 348
See application file for complete search history.

(56) References Cited

U.S. PATENT DOCUMENTS

| | | | |
|---|---|---|---|
| 6,984,924 B1* | 1/2006 | Voigt | F02M 63/0026 310/328 |
| 7,514,847 B2* | 4/2009 | Dick | F02M 51/0603 239/533.2 |
| 8,653,719 B2 | 2/2014 | Al-Bender et al. | 310/328 |
| 2006/0113870 A1* | 6/2006 | Kienzler | F02M 47/027 310/328 |
| 2007/0090724 A1* | 4/2007 | Kato | F02M 47/027 310/311 |
| 2009/0000597 A1* | 1/2009 | Kronberger | H01L 41/0472 123/472 |
| 2009/0140610 A1* | 6/2009 | Venkataraghavan | H01L 41/0533 310/338 |
| 2018/0185173 A1* | 7/2018 | Cianchetti et al. | A61F 6/28 310/311 |

OTHER PUBLICATIONS

Notification Concerning Transmittal of Copy of International Preliminary Report on Patentability (Chapter I of the Patent Cooperation Treaty), in English, dated Feb. 2, 2017, which was issued by the International Bureau of WIPO in Applicant's corresponding international PCT application having Serial No. PCT/DE2015/200411, filed on Jul. 22, 2015.

English translation of the International Preliminary Report on Patentability (Chapter I of the Patent Cooperation Treaty), dated Jan. 24, 2017, which was issued by the International Bureau of WIPO in Applicant's corresponding international PCT application having Serial No. PCT/DE2015/200411, filed on Jul. 22, 2015.

Written Opinion of the International Searching Authority, in English (Jan. 24, 2017—mailed with the English translation of the International Preliminary Report on Patentability), which was issued by the International Bureau of WIPO in Applicant's corresponding international PCT application having Serial No. PCT/DE2015/200411, filed on Jul. 22, 2015.

International Search Report, in English, dated Nov. 26, 2015, which was issued by the International Bureau of WIPO in Applicant's corresponding international PCT application having Serial No. PCT/DE2015/200411, filed on Jul. 22, 2015.

* cited by examiner

ACTUATOR SYSTEM

The invention relates to an actuator device according to claim 1 and an arrangement having a plurality of such actuator devices according to claim 9.

Figure 1:
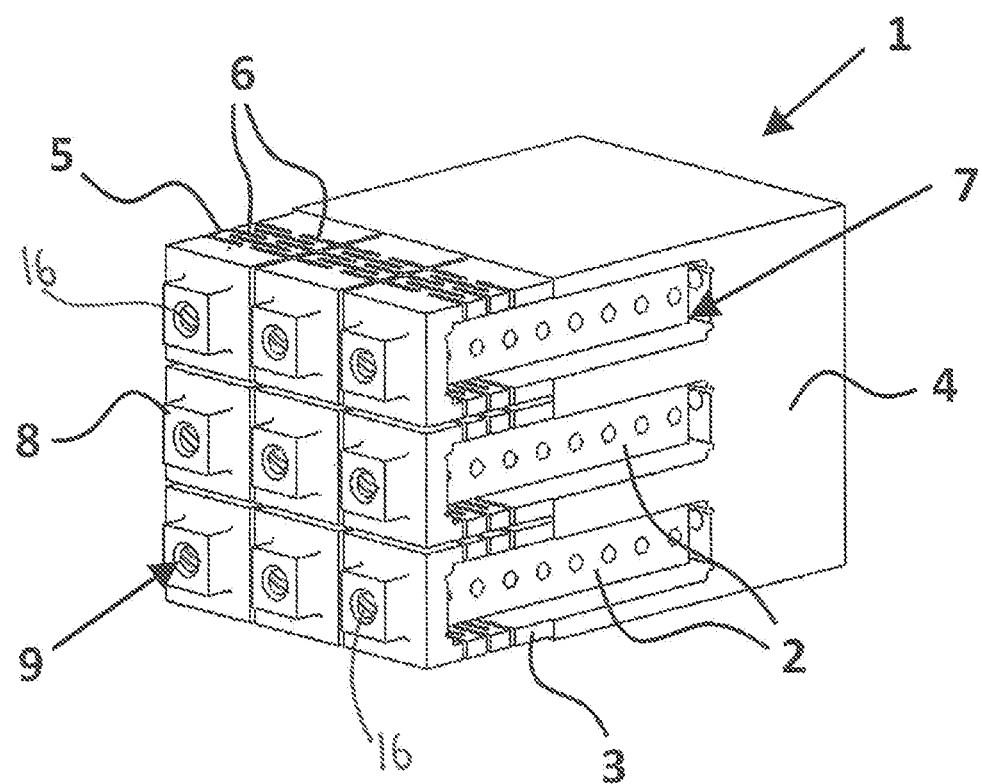

An actuator device having a total of 64 PZT actuators in an 8×8 matrix is known from the scientific article "Structure and closed-loop control of a novel compact deformable mirror for wavefront correction in a high power laser system", Laser Phys. Lett. 10 (2013) (045301) (7 pages), wherein the actuator device is provided to deform the mirrors of a laser system in a targeted manner, in order to correct the wavefront aberration of the laser beam. FIG. 1 of the above-mentioned article shows the design embodiment of the actuator arrangement or mount in detail, in which a compressive pre-tension is applied to the actuator by means of a spring and a clamping screw. This compressive pre-tension is necessary to prevent the corresponding actuator from experiencing a tensile stress, because the PZT ceramic of the actuator can be damaged even in the event of very small tensile stresses.

This design is disadvantageous because of the complex construction having numerous individual parts, which makes the assembly extremely complex, and which becomes more complex the more actuators the actuator device comprises. The assembly is furthermore made more difficult by the necessity of feeding the connection lines through the screw connection at the lower end of the respective actuator. Furthermore, the individual parts used occupy a relatively large space, so that miniaturization of the corresponding actuator device rapidly reaches its limits. In particular as a result of the corresponding arrangement of the compression springs, the spatial extension over the footprint of the actuator is relatively large, so that the spacing of adjacent actuators (pitch) is also relatively large.

An electromechanical motor having an actuator device is known from DE 10 2006 032 995 A1, in which the piezoelectric actuators are pre-tensioned with high compressive forces via spring strips, wherein the spring strips are fastened on structural elements of the motor. The fastening of the spring strips, which are under high tensile stress, during assembly, for example, by a welding method, is disadvantageous in this case, in particular if the actuator device has a plurality of actuators and a correspondingly high number of spring strips.

Attaching the spring strips in an array arrangement of actuators, which are arranged in successive rows, is difficult to impossible in the case of the corresponding internal actuators, which are surrounded on all sides by adjacent actuators.

It is therefore the object of the invention to provide an actuator device which overcomes the disadvantages of the actuator devices known from the above-mentioned prior art. In particular, it is the object of the invention to provide an actuator device having a plurality of actuators, which may be produced simply and rapidly and in which miniaturization having very little spacing between adjacent actuators is easily implementable.

The above object is achieved by an actuator device according to claim 1, wherein the following dependent claims at least comprise advantageous embodiments and refinements.

The invention accordingly proceeds from an actuator device which has at least four electrically activatable, variable-length actuators, in particular piezoelectric actuators. Each of the actuator comprises a separate housing intrinsic thereto, so that the individual housings are provided separately and spaced apart from one another. The term "housing" in the meaning of the present invention refers in this case to an element which does not necessarily surround or enclose the actuator completely, but rather at least partially.

Each housing is embodied integrally or in one piece with a common base element. "Common base element" means in this case that all housings are connected to the same base element, which is common to all housings. A mechanical compressive force is applied to the actuator in a specific and defined region by a springy section, which is formed integrally with the housing, wherein the direction of action of the compressive force extends in parallel to the direction of the longitudinal extension or in parallel to the length change direction of the actuator.

Due to the integral or one-piece embodiment of all housings with the common base element together with the springy section provided integrally in each housing, which applies the compressive force required for the reliable and continuous operation of the actuators, an extremely compact actuator device, which is implementable easily and rapidly with respect to assembly at the same time is achieved, having a very small spacing or pitch between adjacent actuators, because the housing only occupies slightly more space than the actuator itself. In addition, with such a construction, which does not have any screw connections, the handling of the connection lines provided on the actuator for the electrical activation or the guiding/feeding through thereof is comparatively simple. The assembly or the housing insertion of the actuators themselves is also simple and uncomplicated in the actuator device according to the invention.

In a preferred manner, each housing is surrounded by at least two adjacent housings, wherein in a particularly preferred manner, the directions in which the adjacent housings are arranged are substantially perpendicular to one another or enclose an angle of 90°. "Substantially" in this context means that the angle can deviate slightly, i.e., by +/−5%, from 90°.

It can prove to be advantageous that the springy section is formed by slots in the housing, wherein the slots advantageously extend in a direction which runs perpendicularly to the longitudinal extension direction of the housing. These slots ensure the required flexibility or spring action of the housing section, wherein solid-state joints are formed by the slots in the housing in the corresponding sections of the remaining housing material. In addition to slots, other forms of recesses on the housing are conceivable, which also result in a spring action of the housing section.

It can also prove to be advantageous that at least a part of the housing has an opening or a passage, in which the actuator can be inserted, preferably pushed in, in its longitudinal direction, i.e., upright. Particularly simple assembly of the actuator device is achieved in this way, in particular if it has more than two rows of actuators. The insertion or pushing in of internal actuators, i.e., actuators which are arranged closer to or in the center of the matrix arrangement of actuators, is then implementable relatively simply.

The opening or the passage is designed in this case so that its extension in the longitudinal direction before the insertion or placement of the actuator is slightly smaller than the longitudinal extension of the actuator to be inserted therein, wherein the extension of the opening or the passage transversely to the longitudinal direction is dimensioned such that a spacing not equal to zero exists between the actuator, which is inserted into the opening or the passage, and the housing or the base element. As a result of this embodiment of the opening or the passage, the actuator is fixedly clamped via its two end face sides and/or a compressive stress is applied thereto after the insertion into the opening or into the passage, wherein the remaining lateral faces of the actuator are free faces and have no contact to the housing or are arranged spaced apart from the housing.

In addition, it can prove to be advantageous that at least one housing has a contact element, which is provided for direct or indirect contact with an element to be moved or deformed by the actuators.

In this case, it can prove to be advantageous that the contact element has a holding unit, preferably in the form of a thread and more preferably in the form of an internal thread. Simple assembly of the actuator device is achieved in this way, in which lengthening of the housing for inserting or pushing in the actuator is necessary, because the opening/the passage is smaller in its longitudinal extension than the longitudinal extension of the actuator. If an internal thread is provided, a holding means can be screwed in, via which a corresponding tensile force can be exerted on the housing very easily.

Furthermore, it can prove to be advantageous in this case that the contact element has a decoupling section, which reduces or eliminates the introduction of forces transversely to the length change direction of the actuator. Transverse forces can also easily result in damage in particular in the case of a piezoceramic material of the actuator.

Finally, it can prove to be advantageous in this case that the contact element is integrally formed with the housing. An extremely compact and assembly-friendly structure of the actuator device is achieved in this way.

The invention additionally relates to an arrangement or an array arrangement comprising a plurality of the above-described actuator devices, wherein adjacent actuator devices are in contact at least in sections. In this way, an arrangement or an array having a high number of actuators arranged closely adjacent to one another can be achieved in a simple and assembly-friendly manner. In a particularly preferred manner, the adjacent actuator devices are in contact via planar faces or lateral faces of the base element.

In this case, it can be advantageous that the actuator devices are each connected via the base element to a base plate. The actuator devices are particularly advantageously embedded or inserted into the base plate, so that either only the respective housing or a part of the housing or only the respective contact element protrudes beyond the base plate.

Figure 2:
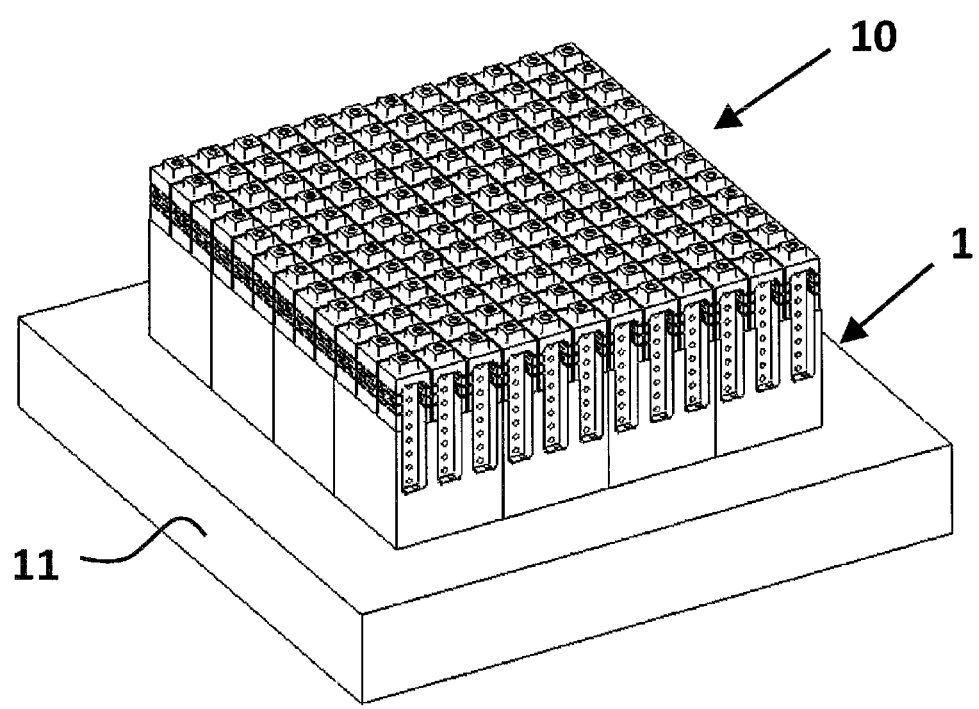
Figure 3:
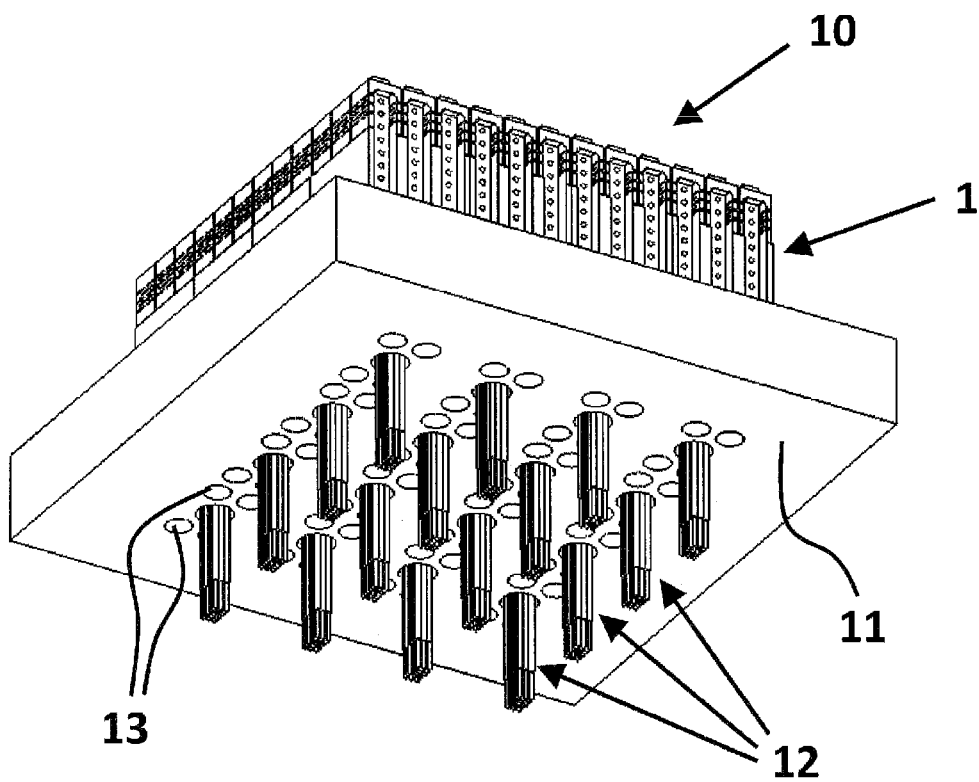
Figure 4:
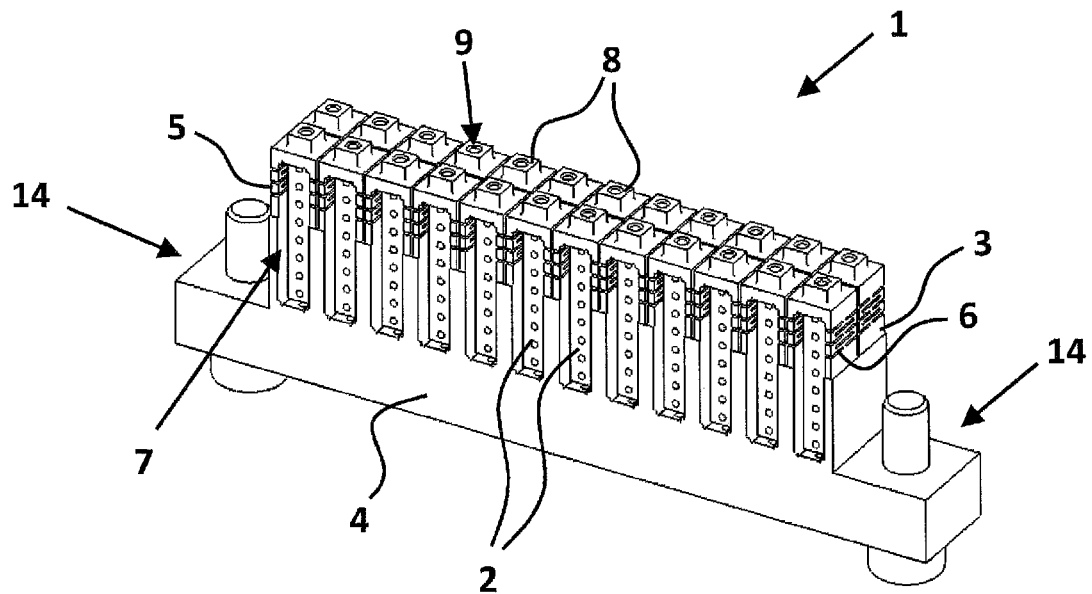
Figure 5:
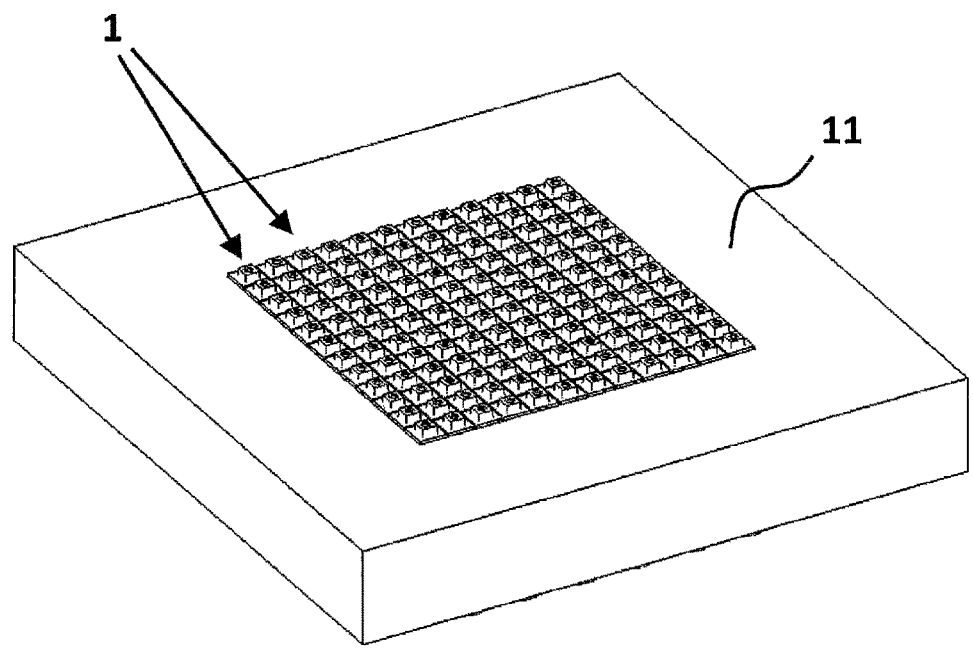
Figure 6:
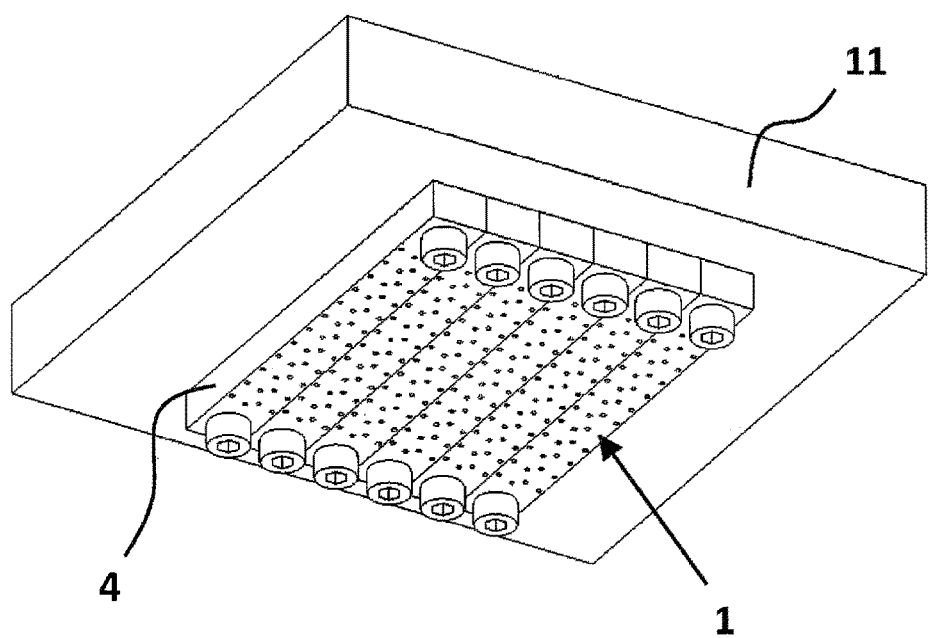

In the figures, which are schematic and not to scale:

FIG. 1: shows an embodiment of an actuator device according to the invention,

FIG. 2: shows an embodiment of an arrangement of the actuator device according to the invention according to FIG. 1, FIG. 3: shows an arrangement according to FIG. 2 in another view, FIG. 4: shows a further embodiment of an actuator device according to the invention, FIG. 5: shows an embodiment of an arrangement of the actuator device according to the invention according to FIG. 4, and FIG. 6: shows an arrangement according to FIG. 5 in another view.

FIG. 1 shows one possible embodiment of the actuator device 1 according to the invention having a total of nine actuators 2 and correspondingly nine housings 3, which surround the actuators, in a 3×3 matrix arrangement. In this case, the individual housings 3 are embodied in one piece or integrally with the common base element 4. The base element and the individual housings consist in this case of a metallic material. The use of other materials, for example, plastics, in particular reinforced plastics, is also possible.

The shape or structure of the housing is implemented by an erosion method. In this case, the section 5, which has a spring action, of the housing 3 is provided with oblong slots or recesses 6 arranged in parallel to one another, wherein the slots or recesses each run transversely in relation to the longitudinal extension of the housing. The remaining material of the housing in the surrounding region of the slots forms solid-state joints in this case, which ensure a defined flexibility or spring action of the corresponding housing section. Further shapes of recesses or notches, which also result in the desired spring action of the housing section, are also conceivable, for example, ellipsoidal or bone-shaped recesses or notches.

Each housing 3 has a housing passage 7, in each of which one piezoelectric actuator is inserted. In this case, the respective actuator is in contact using its lateral surface having the smallest area, which forms an end face, with the corresponding inner side or inner face of the housing or is supported thereon. On the other hand, the same actuator is in contact using its other smallest lateral face with respect to area, which is arranged opposite and which also forms an end face, with the corresponding face of the base element or is also supported thereon. None of the remaining lateral faces of the actuator are in contact with a face of the housing or the base element, so that the length change of the actuator is not obstructed in this way.

Because the passage 7 has a longitudinal extension which is smaller by a defined absolute value before the insertion of the actuator than the longitudinal extension of the actuator to be inserted, after the insertion into the passage, a compressive stress is applied to the actuator, wherein the compressive stress is substantially influenced by the embodiment of the housing with the given materials of base element and housing. Thus, by way of the specific location or arrangement and shape of the slots or recesses introduced into the housing and the difference between the longitudinal extension of the passage 7 and the longitudinal extension before its insertion into the passage, a compressive pre-tension may be achieved in a defined range.

The footprint of an actuator is 3×3 mm$^2$, while the footprint of a housing is 5×5 mm$^2$. The spacing between adjacent housings is 0.5 mm. The above-mentioned dimensions or spacings can be changed and in particular reduced further to implement miniaturization of the actuator device. This miniaturization is only subject to limits by way of the dimensions of the actuator or its cross-sectional area, which has a lower limit.

In each housing, a contact element 8, which is embodied in one piece or integrally with the housing 3, is provided on its free end. However, it is also possible to connect the contact element to the housing by material bonding, for example, by gluing, soldering, or welding. Each contact element has a cuboid shape, wherein other geometric shapes are also conceivable, for example, a pin or mushroom shape.

In this type of the provision of contact elements, it is possible, for example, to eliminate a height difference between individual contact elements easily by a planar grinding process after assembly of the individual actuators in the respective housing passages.

Each contact element 8 is provided with a holding unit 9 in the form of an internal thread 16, with the aid of which a tensile force can be applied to the corresponding housing in a simple manner. This can be performed, for example, by screwing in an element, for example, a hook, having corresponding external thread into the holding unit, wherein, via the application of a tensile force to the hook, this force is transmitted to the housing. Due to the action of the tensile force on the housing with its elastic and springy section 5, a length change or length enlargement of the housing or the corresponding passage 7 results, so that the respective actuator, the longitudinal extension of which is greater than the corresponding longitudinal extension of the respective passage, can be easily inserted or pushed into the passage. Due to subsequent tensile force relief, the housing attempts to assume its original dimensions before the application of tensile force as a result of the springy or elastic action of the springy section 5. However, because the actuator is now inserted into the passage, a return into the original dimension is precluded. As a result of the lengthening of the housing with its springy section now resulting, the exertion of a compressive force on the actuator by the housing surrounding it in the direction of its longitudinal extension results as a consequence.

The 3×3 module shown in FIG. 1 can easily expanded with further corresponding actuator devices, which only have to be attached to the existing module, as a result of its planar lateral faces. FIG. 2 shows a corresponding (array) arrangement 10 having a total of 16 actuator devices 1 according to FIG. 1. In this case, the individual actuator devices abut one another or each touch in the region of the base element. Each actuator device is screwed together with the base plate 11.

FIG. 3 shows the (array) arrangement of FIG. 2 in a view from below, so that in this case the lower side of the base plate 11 is also visible. This base plate is provided with numerous passage boreholes 13, via which, on the one hand, the actuator devices are connected by means of screws to the base plate, and through which, on the other hand, the electrical lines 12, which are connected to the actuators and are used for the activation thereof, are led.

FIG. 4 shows a further possible embodiment of the actuator device according to the invention. This differs from the actuator device shown in FIG. 1 primarily in that another arrangement of the actuators 2 or the housings 3 surrounding them in relation to one another is provided here, and the common base element 4, with which all housings 3 are embodied in one piece or integrally, has another geometric shape. Specifically, the actuator device has two rows each having 12 actuators; it is thus a 12×2 module. The construction of the housings surrounding the actuators is identical to the construction of the housings of the actuator device according to FIG. 1 and was already described in detail above. The shape of the base element 4 is primarily a result of the 12×2 arrangement of the actuators, and accordingly has an elongated shape. At the respective distal end section, the base element has a shoulder or a step, so that a fastening section 14 results, via which the actuator device is fastenable on a base plate. For this purpose, the fastening section has a passage borehole for accommodating a screw.

FIG. 5 shows an (array) arrangement, in which a total of 6 of the 12×2 modules according to FIG. 4 are embedded in the base plate 11, so that essentially only the contact elements 8 protrude at the upper side of the base plate or project beyond the plane formed by the upper side of the base plate. The actuator devices protrude above the long lateral faces of the base element thereof in contact with one another and are connected or screwed together from below with the aid of screws with the base plate via the fastening sections 14. This can be recognized on the basis of FIG. 6, which shows the array arrangement according to FIG. 5 in a view from below, i.e., looking toward the lower side of the base plate.

In contrast to the (array) arrangement according to FIGS. 2 and 3, the base plate does not have passage boreholes here, but rather the respective actuator device or the base element thereof does. However, they are only used here for feeding through the electrical lines leading to the actuators.

The invention claimed is:

1. An actuator device (1) having a prismatic array of at least four electrically activatable, variable-length actuators (2) arranged in at least two rows, wherein a compressive force is applied to each of the at least four electrically activatable, variable-length actuators (2) in its length change direction by a separate housing (3) having an integrally formed springy section (5), wherein each housing (3) is embodied in one piece with a base element (4), which is common to all housings.

2. The actuator device according to claim 1, characterized in that each housing (3) is surrounded by at least two adjacent housings (3).

3. The actuator device according to claim 1, characterized in that the springy section is formed by slots (6) in the housing (3).

4. The actuator device according to claim 1, characterized in that at least a part of the housing has an opening or a passage (7), into which the actuator can be inserted in its longitudinal alignment.

5. The actuator device according to claim 1, characterized in that at least one housing (3) has a contact element (8), which is provided for contact with an element to be moved or deformed by the actuators.

6. The actuator device according to claim 5, characterized in that the contact element has a holding unit (9).

7. The actuator device according to claim 5, characterized in that the contact element has a decoupling section, which reduces or eliminates the introduction of forces transversely to the length change direction of the actuator.

8. The actuator device according to claim 5, characterized in that the contact element is integrally formed with the housing.

9. An arrangement (10) having a plurality of actuator devices (1) according to claim 1, characterized in that adjacent actuator devices are in contact at least in sections.

10. The arrangement according to claim 9, characterized in that the actuator devices are each connected via the base element to a base plate (11).

11. The arrangement according to claim 10, characterized in that the actuator devices are inserted into the base plate (11), so that only the housings or the contact elements protrude beyond the base plate.

12. The actuator device according to claim 4, characterized in that at least a part of the housing has an opening or a passage (7), into which the actuator can be pushed in its longitudinal alignment.

13. The actuator device according to claim 6, wherein the holding unit (9) is in the form of a thread.

14. The actuator device according to claim 6, wherein the holding unit (9) is in the form of an internal thread.

15. The arrangement (10) having a plurality of actuator devices (1) according to claim 9, characterized in that adjacent actuator devices are in contact at least in sections in the region of the respective base element.

* * * * *